US008897652B2

(12) United States Patent
Uemura

(10) Patent No.: US 8,897,652 B2
(45) Date of Patent: Nov. 25, 2014

(54) OPTICAL TRANSMISSION CIRCUIT AND OPTICAL TRANSMISSION/RECEPTION CIRCUIT MODULE

(71) Applicant: Kabushiki Kaisha Toshiba, Tokyo (JP)

(72) Inventor: Hiroshi Uemura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 88 days.

(21) Appl. No.: 13/782,514

(22) Filed: Mar. 1, 2013

(65) Prior Publication Data

US 2013/0322886 A1 Dec. 5, 2013

(30) Foreign Application Priority Data

May 31, 2012 (JP) ................ P2012-124490

(51) Int. Cl.
*H04B 10/04* (2006.01)
*H04B 10/12* (2006.01)
*H04B 10/00* (2013.01)
*H01S 3/00* (2006.01)
*H04B 10/50* (2013.01)
*H01S 5/042* (2006.01)

(52) U.S. Cl.
CPC ............ *H04B 10/50* (2013.01); *H01S 5/0427* (2013.01)
USPC ...... 398/182; 398/135; 372/38.02; 372/38.07

(58) Field of Classification Search
USPC ................. 398/135–172, 182–201; 372/38.01–38.1
See application file for complete search history.

(56) References Cited

U.S. PATENT DOCUMENTS 5,796,767 A 8/1998 Aizawa
2002/0126360 A1* 9/2002 Tokita ........................ 359/180
2003/0180054 A1* 9/2003 Watanabe et al. ............ 398/182

FOREIGN PATENT DOCUMENTS

JP 2000-124862 4/2000
JP 2007-053389 3/2007
JP 2008085170 A 4/2008

* cited by examiner

*Primary Examiner* — David Payne
*Assistant Examiner* — Casey Kretzer
(74) *Attorney, Agent, or Firm* — Patterson & Sheridan, LLP

(57) ABSTRACT

An optical transmission circuit comprises a light emitting element and a differential amplifier circuit to which differential input signals are input to modulate an optical output of the light emitting element. The differential amplifier circuit includes a first current source, a first transistor, a second transistor, a third transistor, and a fourth transistor. The first current source is connected to a first potential source and the sources of the third and the fourth transistor are connected to a second potential source. The differential amplifier circuit includes a second current source having one end that is connected to a third potential and another end that is connected to a drain of the second transistor, and a fifth transistor having a gate that is connected to the gate of the fourth transistor, a source that is connected to the second potential, and a drain that is connected to the light emitting element.

12 Claims, 4 Drawing Sheets

US 8,897,652 B2

OPTICAL TRANSMISSION CIRCUIT AND OPTICAL TRANSMISSION/RECEPTION CIRCUIT MODULE

CROSS REFERENCE TO RELATED APPLICATION(S)

This application is based upon and claims the benefit of priority from Japanese Patent Application No. 2012-124490, filed on May 31, 2012, the entire contents of which are incorporated herein by reference.

FIELD

Embodiments of the present application relate to an optical transmission circuit and an optical transmission/reception circuit module.

BACKGROUND

In recent years, the amount of signals processed in information communication devices have increased due to enhanced performance of electronic devices and an increase in size of multimedia contents. As a result, the signal transmission speed in wirings inside and outside the electronic devices has increased. This has led to problems of transmission loss and electromagnetic noise interference. Therefore, optical signals have gained attention due to their benefits of high speed and low noise transmission, and various optical transmission circuits have been proposed.

DETAILED DESCRIPTION

Embodiments provide an optical transmission circuit and an optical transmission/reception circuit module that are capable of low power, high speed operation.

Embodiments are explained in detail below with reference to the drawings.

According to the embodiments, an optical transmission circuit comprises a light emitting element and a differential amplifier circuit to which differential input signals are input to modulate an optical output of the light emitting element. The differential amplifier circuit includes a first current source having a first end and second end, the first end being connected to a first potential source, a first transistor having a first source, a first drain, and a first gate, the first source being connected to the second end, one of differential input signals being supplied to the first gate, a second transistor having a second source, a second drain, and a second gate, the second source being connected to the second end, another one of the differential input signals being supplied to the second gate, a third transistor having a third source, a third drain, and a third gate, the third gate and the third drain being connected to the first drain, the third source being connected to a second potential source, and a fourth transistor having a fourth source, a fourth drain, and a fourth gate, the fourth gate and the fourth drain being connected to the second drain, the fourth source being connected to the second potential source. The differential amplifier circuit also includes a second current source having a third end and a fourth end, the third end being connected to a third potential source, and the fourth end being connected to the second drain, and a fifth transistor having a fifth source, fifth drain, and a fifth gate, the fifth gate being connected to the fourth gate, the fifth source being connected to the second potential source and the fifth drain being connected to the light emitting element.

(First Embodiment)

Figure 1:
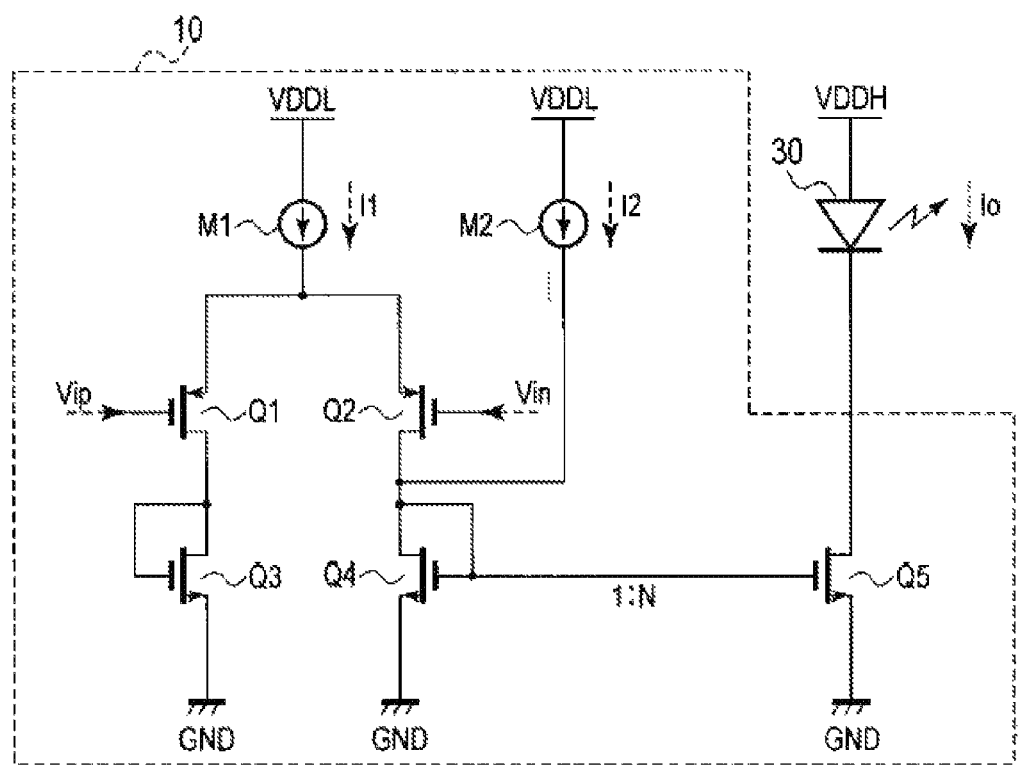
FIG. 1 is a schematic circuit diagram illustrating a configuration of an optical transmission circuit according to a first embodiment.

FIG. 1 is a schematic circuit diagram illustrating a configuration of an optical transmission circuit according to a first embodiment.

Symbol M1 is a current source (first current source) that generates current I1. One end of the current source M1 is connected to VDDL (first potential; 1.2V). Symbol Q1 is a p-type MOS (pMOS) transistor. A source of the pMOS transistor is connected to the other end of the current source M1, and a gate of the pMOS transistor Q1 receives an input of Vip (one of differential input signals). Symbol Q2 is a pMOS transistor (second transistor). A source of the pMOS transistor Q2 is connected to the other end of the current source M1, and a gate of the pMOS transistor Q2 receives an input of Vin (the other one of the differential input signals). Symbol Q3 is an nMOS transistor (third transistor). A gate and a drain of the nMOS transistor Q3 are connected to a drain of the pMOS transistor Q1 and a source of the nMOS transistor Q3 is connected to the ground GND (second potential). Symbol Q4 is an nMOS transistor (fourth transistor). A gate and a drain of the nMOS transistor Q4 are connected to a drain of the pMOS transistor Q2, and a source of the nMOS transistor Q4 is connected to the ground GND.

These elements form a differential amplifier circuit with the pMOS transistors Q1 and Q2 acting as a signal input transistors and the nMOS transistors Q3 and Q4, which are connected as diodes, acting as loads. The nMOS transistors Q3 and Q4 preferably have the same parameters (e.g., channel width, channel length, and threshold voltage) within a range of manufacturing fluctuations (e.g., ±10% error from the designed values). Therefore, the load on one side of the current path of the differential amplifier circuit (nMOS transistor Q3 connected as a diode) and the load on the other side (nMOS transistor Q4 connected as a diode) become symmetrical. As a result, degradation of signal quality, such as duty variation and cross point shifting, due to non-symmetry of the rising and falling, for example, of the output waveform of the differential amplifier circuit, is prevented, allowing a high quality signal output.

Symbol Q5 is an nMOS transistor (filth transistor). A gate of the WOOS transistor Q5 is connected to the drain of the pMOS transistor Q2 and the gate and the drain of the nMOS transistor Q4, and a source of the nMOS transistor Q5 is connected to the ground GND. The LIMOS transistors Q4 and Q5 configure a current mirror circuit. Drain current (Io) of the nMOS transistor Q5 is determined by multiplying the drain current of the nMOS transistor Q4 by a mirror ratio (a ratio of values determined by dividing a gate width W by a gate length L; N in the present embodiment). In the present embodiment, N is set to be larger than 1.

Symbol M2 is a current source (second current source) that generates current I2. One end of the current source M2 is connected to VDDL (third potential) and the other end is connected to the drain of the pMOS transistor Q2 and the gate and the drain of the nMOS transistor Q4. Thus, in the present embodiment, the first potential is the same as the third potential.

A current output circuit 10 is configured from the above-described differential amplifier circuit, the power source M2 and the nMOS transistor Q5. A light emitting element 30 is connected to an output end of the current output circuit 10. That is, one end of the light emitting element 30 that converts the current signal Io into an optical signal is connected to VDDH (fourth potential; e.g., 3.3V) that is higher than VDDL, and the other end is connected to a drain of the nMOS transistor Q5 of the current output circuit 10.

The light emitting element 30 is produced on a GaAs substrate, for example. A wavelength of light emitted by the light emitting element 30 is 850 nm, for example. A surface emitting laser (VCSEL: Vertical Cavity Surface Emitting Laser), for example, may be used as the light emitting element 30. The light emitting element 30 may be formed on a compound semiconductor (e.g., GaAlAs/GaAs, InGaAs/InP, and SiGe, and the like) or a substrate of Si and Ge, and the like. The wavelength may be appropriately changed as needed. In addition, an array chip on which a plurality of light emitting elements are formed within a single chip may be used as the light emitting element 30.

In the current output circuit 10, the drain current (output current) of the nMOS transistor Q5 is modulated by the differential input signals. More specifically, the output current increases to Io=N×(I1+I2) in accordance with an increase in (Vip−Vin). Moreover, the output current decreases to Io=N× I2 in accordance with the decrease in (Vip−Vin). At this time, the drain current that flows through the nMOS transistors Q3 and Q4 is first modulated by the differential input signals Vip and Vin. Next, the current that flows through the nMOS transistor Q5 in the current mirror circuit is determined by multiplying the drain current that flows through the nMOS transistor Q4 by the mirror ratio N. In other words, the output current (the drain current of the nMOS transistor Q5) can be controlled with small current (the drain current of the nMOS transistor Q4). Therefore, a low power operation is possible.

Figure 2:
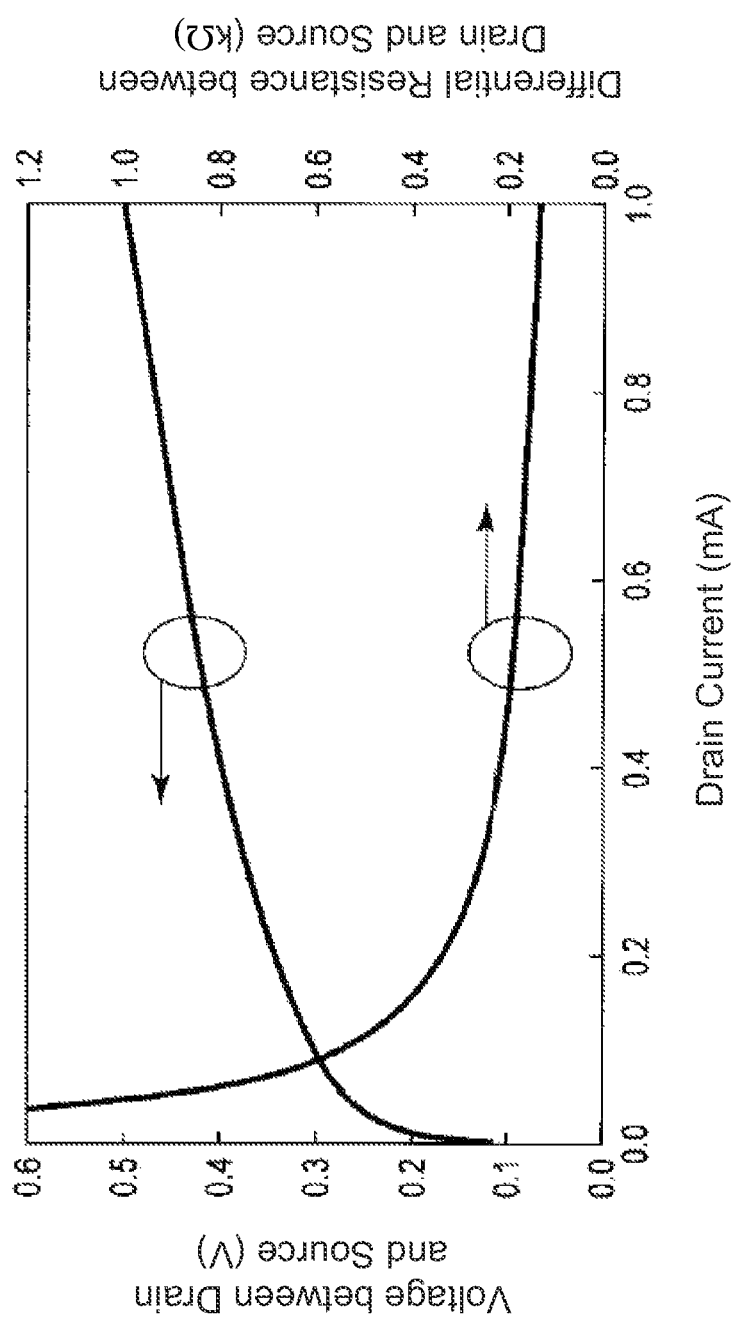
FIG. 2 is a schematic diagram illustrating a voltage between a drain and a source and a differential resistance between a drain and a source for an n-type metal oxide semiconductor (nMOS) transistor connected as a diode.

Changes in the voltage between the drain and the source and changes in the differential resistance between the drain and the source, in accordance with the drain current of the nMOS transistor Q4 connected as a diode, are illustrated in FIG. 2. As shown in FIG. 2, the differential resistance is large (1 kΩ or more in the present embodiment) when the voltage between the drain and the source is smaller than the diode current rising voltage (approximately 0.2 V in the present embodiment) (i.e., when the nMOS transistor Q4 connected as a diode is assumed to be off). On the other hand, the differential resistance is small (1 kΩ or less in the present embodiment) when the voltage between the drain and the source is sufficiently greater than the diode current rising voltage (i.e., when the nMOS transistor Q4 connected as a diode is on). With a MOS transistor connected as a diode, the diode current rising voltage corresponds to a threshold voltage of the MOS transistor.

In the current output circuit 10, the drain current regularly flows into the nMOS transistor Q4 by the current source M2, so that the nMOS transistor Q4 connected as a diode is always turned on. As a result, the differential resistance between the source and the drain of the nMOS transistor Q4, which is a discharge path of the charge that has accumulated at the gate of the nMOS transistor Q4 and the gate of the nMOS transistor Q5, is maintained low when the output current decreases. Therefore, a faster rising operation is possible compared with a case without the current source M2. Moreover, the gate voltage of the nMOS transistor Q4 and the gate voltage of the nMOS transistor Q5 are maintained more than a certain voltage (approximately 0.2 V or greater in the present embodiment). As a result, the amount of change in the gate voltage of the nMOS transistor Q4 and the gate voltage of the nMOS transistor Q5 at the time of modulation of the output current is smaller compared with the case without the current source M2. Therefore, a faster rising operation is possible. Accordingly, faster output current modulation operation (e.g., 1 Gbps or greater) is possible.

In contrast, without the current source M2, the nMOS transistor Q4 shifts from the on state to the off state in accordance with the decrease in (Vip−Vin). Therefore, a channel resistance attic nMOS transistor Q4 rapidly increases. As a result, more time is required to discharge the charge that has accumulated at the gate of the nMOS transistor Q4 and the gate of the nMOS transistor Q5 when the output current decreases, compared with the case with the current source M2. In addition, the amount of change in the gate voltage of the nMOS transistor Q4 and the gate voltage of the nMOS transistor Q5 at the time of output current modulation is greater compared with the case with the current source M2. Therefore, more time is required for the current to rise. As a result of these issues, the change in the voltage at the gate of the nMOS transistor Q4 and the gate of the LIMOS transistor Q5 cannot catch up the change of the differential signal inputs Vip and Vin, preventing the fast output current modulation operation. More specifically, an increase in jitter and an increase in a bit error rate (BER) occur due to degradation of rising and falling through rate of the output current and inter symbol interference (ISI), causing a remarkable decrease in the signal transmission quality.

As discussed above, with the current output circuit 10 adapting the present embodiment, a tow power output current medication operation is possible using the current mirror circuit configured from the nMOS transistor Q4 and the nMOS transistor Q5. In addition, a faster output current modulation operation is possible with the current source M2.

As discussed above, because the current signal Io changes from N×I2 to N×(I1+I2), the current signal Io includes a steady component of N×I2 and a modulation component of N×I1. That is, with addition of the current source M2, the power consumption of the current output circuit 10 increases by I2+N×I2. However, the regular component N×I2 is used as a bias current of the light emitting element 30, and the voltage between the anode and the cathode of the light emitting element 30 is set to or greater than the diode current rising voltage. As a result, the differential resistance of the light emitting element 30, which is a circuit load of the current output circuit 10, is suppressed low, and thereby the high speed modulation (e.g., 1 Gbps or greater) of the optical output of the light emitting element 30 is achieved by the modulation component N×I1. With such a configuration, the current consumption increased by addition of the current source M2 in the current output circuit 10 is optimized.

If the regular component N×I2 of the current signal Io is not enough as the bias current for the light emitting element 30, a current path that provides the bias current to the light emitting element 30 may be separately provided.

In the present embodiment, one end of the light emitting element 30 is not connected to VDDL, but to VDDH (fourth potential; 3.3 V in the present embodiment) that provides a higher potential than VDDL. As a result, the low power and high speed optical output modulation operation is possible using the current output circuit 10 even when the drive voltage of the light emitting element 30 is high. For instance, if the light emitting element 30 is configured from GaAs, the current rising voltage of the light emitting element 30 is 1.0 V or greater, for example. Therefore, VDDL, which is the power source voltage of the circuit (1.2 V in the present embodiment), cannot sufficiently drive the light emitting element 30. However, as shown in FIG. 1, by setting the power source voltage of the light emitting element 30 to VDDH (3.3 V in the present embodiment), the light emitting element 30 is sufficiently driven.

As a result, in addition to the current amplification effect due to the current mirror circuit, the current output circuit 10 can be configured with VDDL as the power source voltage even when the power source voltage for the light emitting element 30 is VDDH, which is higher than VDDL. In other words, the power amplification rate in the current mirror circuit of the current output circuit 10 equals to the mirror ratio N multiplied by VDDH/VDDL resulting in higher power consumption reduction effect. Conversely, from the viewpoint of the power consumption of the entire circuit, the percentage of increase in the power consumption (VDDL×I2) as a result of addition of the current source M2 is reduced, and effects of the high speed optical output modulation operation are accomplished with smaller increase in the power consumption.

As described above, with the optical transmission circuit of the present embodiment low power and high speed optical output modulation operation is possible, allowing further optimization of current consumption of the circuit. In addition, by connecting the light emitting element 30 to VDDH, the current amplification rate improves at the time of current mirror, further increasing the reduction effect of power consumption.

In FIG. 1, each of the current sources M1 and M2 of the current output circuit 10 may be configured from pMOS transistors, for example. For instance, with respect to the current source M1, a source of the pMOS transistor of the current source M1 is connected to VDDL, and the drain is connected to the source of the pMOS transistor Q1 and the source of the pMOS transistor Q2. A predetermined voltage is applied to the gate. Moreover, each of the current power sources M1 and M2 may be configured from pMOS transistors connected as cascodes. In either case, the current sources M1 and M2 configure a current mirror circuit that multiplies, by the mirror ratio, the reference current generated by a band gap reference circuit, for example.

FIG. 1 illustrates an example in which the signal input transistors are configured from pMOS transistors and in which the diode connection loads and the current mirror circuit are configured from nMOS transistors. However, the signal input transistors may be configured from nMOS transistors, and the diode connection loads and the current mirror circuit may be configured from pMOS transistors. In such cases, the tow power, high speed output current modulation operation is achieved by the current mirror circuit configured from the pMOS transistors.

(Second Embodiment)

Figure 3:
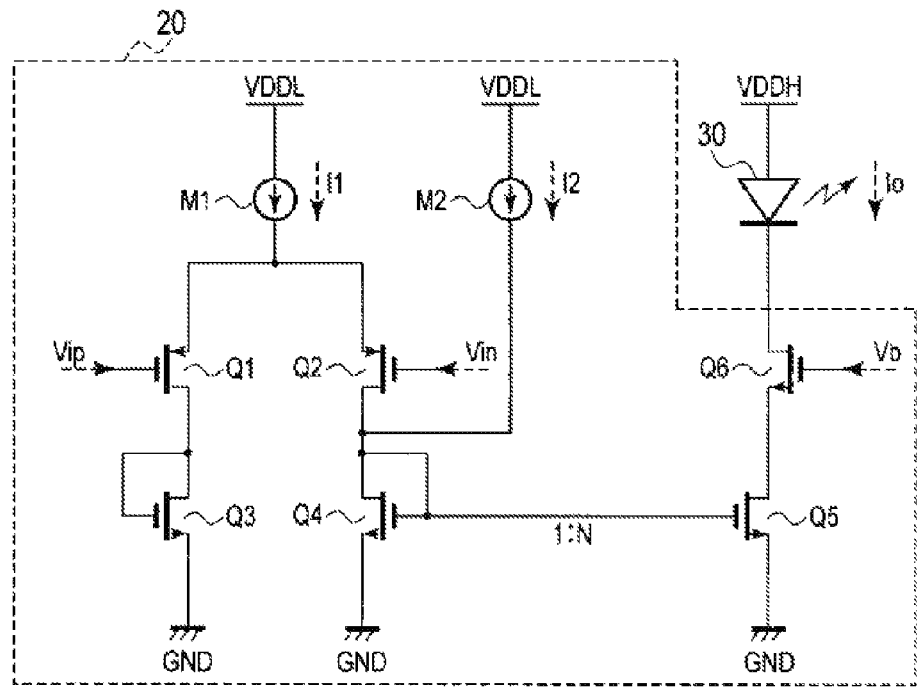
FIG. 3 is a schematic circuit diagram illustrating a configuration of an optical transmission circuit according to a second embodiment.

FIG. 3 illustrates an optical transmission circuit according to a second embodiment. The second embodiment differs from the first embodiment with respect to an attempt to improve reliability of the circuit. Parts that are the same as those in FIG. 1 are indicated with the same symbols, and their detailed explanations are omitted.

In FIG. 3, one end of the light emitting element 30 is connected to VDDH (fourth potential; 3.3 V in the present embodiment), In addition, symbol Q6 is an nMOS transistor. A gate of the nMOS transistor Q6 is applied with a predetermined voltage (Vb). A source of the nMOS transistor Q6 is connected to the drain of the nMOS transistor Q5, and a drain of the nMOS transistor Q6 is connected to the other end of the light emitting element 30. The nMOS transistor Q6 withstands the voltage equal to or greater than VDDH, In other words, a current output circuit 20 according to the present embodiment further includes the nMOS transistor Q6 in addition to the configuration shown in FIG. 1.

in FIG. 3, the pMOS transistors Q1 and Q2, and the nMOS transistors Q3, Q4, and Q5 are MOS transistors that operate at the power source voltage VDDL, and withstand the voltage of VDDL. This is because the power consumption is further reduced as the circuit operates at a lower voltage and because higher speed operation is possible with reducing a thickness of a gate insulation film and shrinking the processes into smaller processes. Therefore, the element is possibly damaged with overvoltage when the power source voltage VDDH of the light emitting element 30 is applied to these MOS transistors. In particular, such possibility is high with the nMOS transistor Q5 that is serially connected to the power source voltage VDDH.

In the optical transmission circuit shown in FIG. 3, the nMOS transistor Q5 is not damaged by the overvoltage because the voltage applied to the nMOS transistor Q5 is limited by using the nMOS transistor Q6. More specifically, the voltage applied to the drain of the nMOS transistor Q5 is Vb−Vt or less, where the value Vt is a threshold voltage of the nMOS transistor Q6. Therefore, the voltage greater than VDDL is not applied to the nMOS transistor Q5 if the value Vb is property set (e.g., VDDL).

As described above, in the optical transmission circuit of the present embodiment, the low power and high speed optical output modulation operation is possible similar to the first embodiment as discussed above. In addition, by providing the nMOS transistor Q6, damaging the LIMOS transistor Q5 due to the overvottage is prevented. In other words, the reliability of the circuit is increased.

FIG. 3 illustrates an example in which the signal input transistors are configured from pMOS transistors and in which the diode connection loads and the current mirror circuit are configured from nMOS transistors. However, the signal input transistors may be configured from nMOS transistors, and the diode connection loads and the current minor circuit may be configured from pMOS transistors.

(Third Embodiment)

Figure 4:
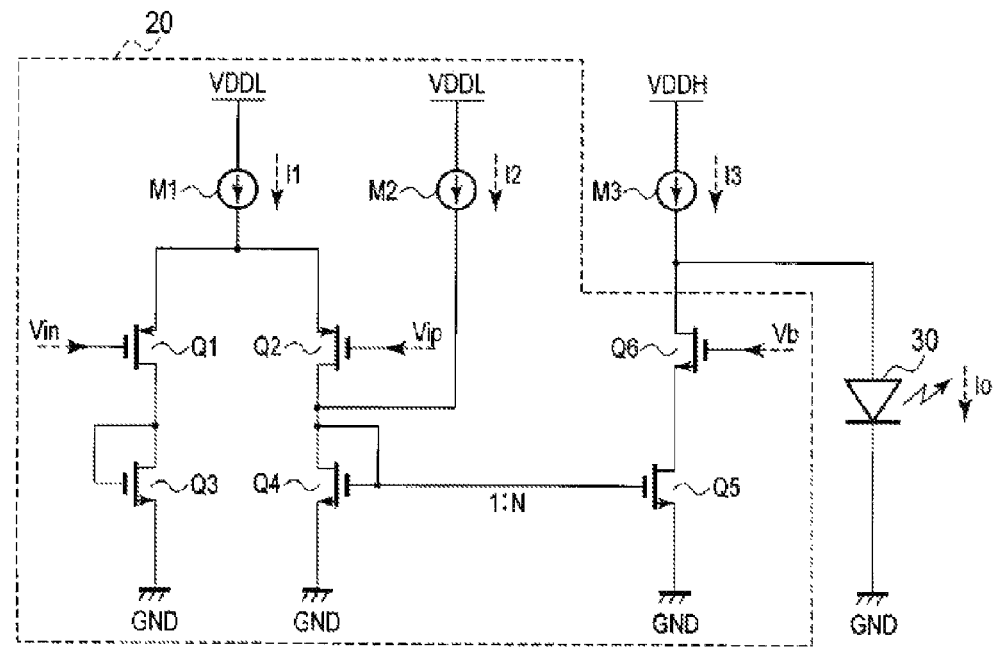
FIG. 4 is a schematic circuit diagram illustrating a configuration of an optical transmission circuit according to a third embodiment.

FIG. 4 is a schematic circuit diagram illustrating a configuration of an optical transmission circuit according to a third embodiment. Parts that are the same as those in FIGS. 1 and 3 are indicated with the same symbols, and their detailed explanations are omitted.

The difference of the present embodiment from the second embodiment is the connection position of the light emitting element 30. That is, in the second embodiment, the anode of the light emitting element 30 is connected to VDDH, and the cathode is connected to the current output circuit to perform the optical output modulation. However, in the present embodiment, as shown in FIG. 4, the cathode is connected to the ground GND, and the anode is connected to the current output circuit 20 to perform the optical output modulation. Further, in the present embodiment, the output end of the current output circuit 20 is connected to a current source third current source).

In FIG. 4, symbol M3 is a current source (third current source) that generates current 13. One end of the current source M3 is connected to VDDH (fourth potential; e.g., 3.3 V), and the other end is connected to the output end of the current output circuit 20. One end of the light emitting element 30 is connected to the ground (second potential), and the other end is connected to the other end of the current source M3 and the current output circuit 20.

In the optical transmission circuit shown in FIG. 4, the current Io that flows through the light emitting element 30 increases to I3−N×I2 in accordance with the increase in (Vip−Vin). in addition, the current to decreases to I3−N×(I1+I2) in accordance with the decrease in (Vip−Vin). Here, Vip is applied to the gate of Q2 and Vin is applied to the gate of Q1.

Even with such a configuration, the low power, high speed optical output modulation operation is possible. Further, the current consumption of the circuit is optimized. Moreover, the advantage of increasing the reliability of the circuit by providing the nMOS transistor Q6 is the same as that in the second embodiment. Accordingly, the same effects as those of the second embodiment are achieved.

Here, in case where an array chip in which a plurality of light emitting elements are formed in a single chip is used as the light emitting element 30, it is preferable to use the optical transmission circuit of the second embodiment (FIG. 3) that drives the cathode of the light emitting elements when anode-common light emitting elements for which the anodes form a common element is used. On the other hand, it is preferable to use the optical transmission circuit of the present embodiment (FIG. 4) that drives the anodes of the light emitting elements when cathode-common light emitting elements for which the cathodes form a common element is used. As a result, each of the light emitting elements are driven in the array chip.

FIG. 4 illustrates an example in which the signal input transistors are configured from pMOS transistors and in which the diode connection loads and the current mirror circuit are configured from nMOS transistors. However, the signal input transistors may he configured from nMOS transistors, and the diode connection loads and the current mirror circuit may be configured from pMOS transistors.

(Fourth Embodiment)

Figure 5:
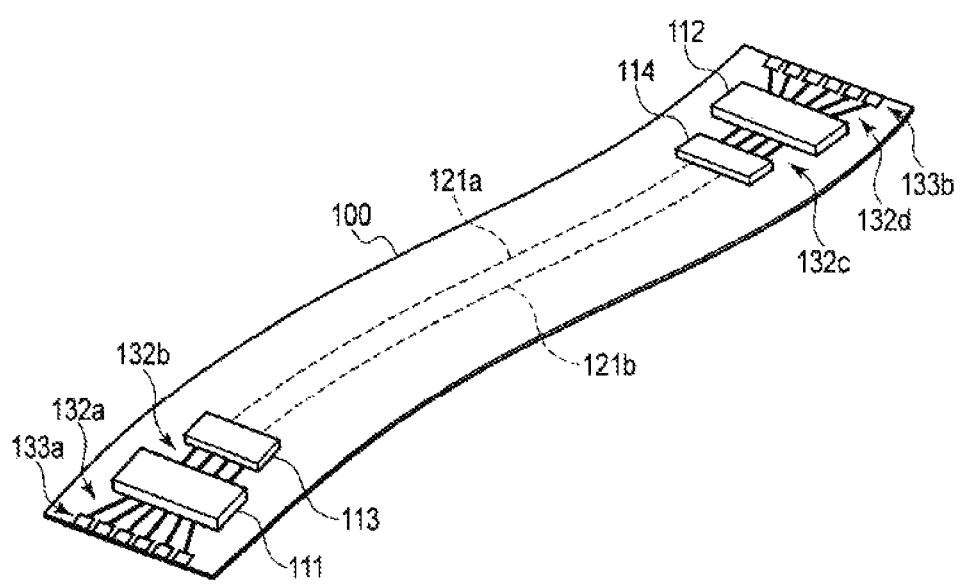
FIG. 5 is a schematic circuit diagram illustrating a configuration of an optical transmission/reception circuit module according to a fourth embodiment.

FIG. 5 illustrates an optical transmission/reception circuit module according to a fourth embodiment. The optical transmission/reception circuit module according to the present embodiment features the use of the optical transmission circuit according to the first to third embodiments.

FIG. 5 illustrates a flexible optoelectronic wiring board 100, a light emitting element 113, a light receiving element 114, a transmission circuit integration circuit (IC) 111, a reception circuit IC 112, optical waveguides 121 (121a and 121b), electric wirings 132 (132a, 132b, 132c, and 132d), and electric connection terminals 133 (133a and 133b).

The flexible optoelectronic wiring board 100 is a flexible printed circuit (FPC), for example, and includes an optical wiring layer in which the optical waveguides 121 are formed, and an electric wiring layer in which the electric wirings 132 are formed. For example, the optical wiring layer is formed in the down layer of the electric wiring layer. The light emitting element 113, the light receiving element 114, the transmission circuit IC 111, and the reception circuit IC 112 are mounted on a surface of the flexible optoelectronic wiring board 100 and electrically connected to the electric wirings 132. Mirrors are formed on both ends of the optical waveguides 121. The light emitting element 113 is positioned at a mirror at one end of the optical waveguides 121, and the light receiving element 114 is positioned at a mirror at the other end of the optical waveguides 121. As a result, the light emitting element 113 and the light receiving element 114 are optically coupled with each other through the optical waveguides 121.

In the optical transmission/reception circuit module shown in FIG. 5, the transmission circuit IC 111 drives the light emitting element 113 based on electric signals inputted from the electric connection terminal 133a at one end, Then, optical signals are generated by the light emitting element 113. The optical signals propagate through the optical waveguides 121 and are converted to electric signals by the light receiving element 114, The electric signals are amplified. by the reception circuit IC 112 and are outputted from the electric connection terminal 133b at the other end.

In the optical transmission/reception module shown in FIG. 5, the transmission circuit IC 111 and the light emitting element 113 configure the optical transmission circuit, and the current output circuit described in the first to third embodiments is used in the transmission circuit IC 111. As a result, low power, high speed light output modulation operation is possible. In addition, the optical transmission/reception circuit module of the present embodiment achieves the advantages of the previous embodiments.

The optical waveguides 121 (121a and 121b) are used as light transmission paths in the optical transmission/reception circuit module shown in FIG. 5. However, optical fibers may be used instead. In this case, a coupling member that couples the optical fibers with the light emitting element/light receiving element and a printed wiring board for mounting the coupling member and the transmission circuit IC/reception circuit IC may be separately used. Wire bonding may be used for electric connection between the light emitting element 113 and the transmission circuit IC 111 and between the light receiving element 114 and the reception circuit IC 112.

Moreover, in the optical transmission/reception circuit module shown in FIG. 5, the transmission circuit IC 111 and the light emitting element 113 are mounted at one end, and the reception circuit IC 112 and the light receiving element 114 are mounted on the other end. However, both of the transmission circuit IC 111 and the reception circuit IC 112 and both of the light emitting element 113 and the light receiving element 114 may be mounted at both ends. In addition, the transmission circuit IC 111 and the reception circuit IC 112 may be a transceiver IC that is capable of both transmission and reception of signals. Moreover, the light emitting element 113 and the tight receiving element 114 may be a light receiving/emitting element that is capable of emitting and receiving light.

(Modifications)

The disclosure of the present application is not limited to the above-described embodiments. Each of the blocks, circuits, circuit elements in the blocks and the circuits, and other components explained in each embodiment are merely examples and may be appropriately replaced with substitutes that achieves the same functions. For example, examples that use MOS transistors are explained above. However, instead of the MOS transistors, field effect transistors, bipolar transistors, bipolar complimentary MOS (Bi-CMOS) transistors may be used. Moreover, various tight emitting elements, such as a light emitting diode and a semiconductor laser, and the like, may be used as the light emitting element, Furthermore, various light receiving elements, such as a P-i-N photodiode (PIN photodiode), a (metal-semiconductor-metal photodiode (MSM photodiode), an avalanche photodiode, and photoconductor and the like, may be used as the light receiving element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and the spirit of the inventions.

What is claimed is:

1. An optical transmission circuit, comprising:
   a light emitting element; and
   a differential amplifier circuit to which differential input signals are input to modulate an optical output of the light emitting element, wherein the differential amplifier circuit includes
      a first current source having a first end and a second end, the first end being connected to a first potential source,
      a first transistor having a first source, a first drain, and a first gate, the first source being connected to the second end, one of the differential input signals being supplied to the first gate,
      a second transistor having a second source, a second drain, and a second gate, the second source being connected to the second end, another one of the differential input signals being supplied to the second gate,
      a third transistor having a third source, a third drain, and a third gate, the third gate and the third drain being connected to the first drain, the third source being connected to a second potential source,
      a fourth transistor having a fourth source, a fourth drain, and a fourth gate, the fourth gate and the fourth drain being connected to the second drain, the fourth source being connected to the second potential source,
      a second current source having a third end and a fourth end, the third end being connected to a third potential source, and the fourth end being connected to the second drain, and
      a fifth transistor having a fifth source, a fifth drain, and a fifth gate, the fifth gate being connected to the fourth gate, the fifth source being connected to the second potential source and the fifth drain being connected to the light emitting element, and
   wherein the light emitting element is disposed between a fourth potential source and the fifth drain, and a potential of the fourth potential source is higher than potentials of the first and third potential sources which are equal.

2. The optical transmission circuit according to claim 1, further comprising:
   a sixth transistor that is disposed between the light emitting element and the fifth drain and that withstands a voltage equal to or higher than a potential of the fourth potential source.

3. The optical transmission circuit according to claim 1, wherein
   the third transistor and the fourth transistor have the same channel widths, the same channel lengths, and the same threshold voltages.

4. The optical transmission circuit according to claim 1, wherein
   the fourth transistor and the fifth transistor configure a current mirror circuit, and drain current of the fifth transistor is larger than drain current of the fourth transistor.

5. An optical transmission/reception circuit module, comprising:
   the optical transmission circuit according to claim 1;
   an optical transmission medium through which an optical signal outputted from the light emitting element of the optical transmission circuit is transmitted;
   a light receiving element that receives the optical signal transmitted through the optical transmission path and generates an electric signal; and
   an amplifying circuit that amplifies and outputs the electric signal.

6. An optical transmission circuit, comprising:
   a light emitting element;
   a differential amplifier circuit to which differential input signals are input to modulate an optical output of the light emitting element, wherein the differential amplifier circuit includes
      a first current source having a first end and a second end, the first end being connected to a first potential source,
      a first transistor having a first source, a first drain, and a first gate, the first source being connected to the second end, one of the differential input signals being supplied to the first gate,
      a second transistor having a second source, a second drain, and a second gate, the second source being connected to the second end, another one of the differential input signals being supplied to the second gate,
      a third transistor having a third source, a third drain, and a third gate, the third gate and the third drain being connected to the first drain, the third source being connected to a second potential source,
      a fourth transistor having a fourth source, a fourth drain, and a fourth gate, the fourth gate and the fourth drain being connected to the second drain, the fourth source being connected to the second potential source,
      a second current source having a third end and a fourth end, the third end being connected to a third potential source, and the fourth end being connected to the second drain, and
      a fifth transistor having a fifth source, a fifth drain, and a fifth gate, the fifth gate being connected to the fourth gate, the fifth source being connected to the second potential source and the fifth drain being connected to the light emitting element; and
   a third current source having a fifth end and a sixth end, the fifth end being connected to a fourth potential, and the sixth end being connected to the fifth drain, wherein the light emitting element is connected between the sixth end and the second potential source.

7. The optical transmission circuit according to claim 6, wherein a potential of the fourth potential source is higher than a potential of the first potential source.

8. The optical transmission circuit according to claim 6, wherein a potential of the fourth potential source is higher than a potential of the third potential source.

9. The optical transmission circuit according to claim 6, further comprising:
   a sixth transistor that is disposed between the sixth end and the fifth drain and that withstands a voltage equal to or higher than a potential of the fourth potential source.

10. The optical transmission circuit according to claim 6, wherein
   the third transistor and the fourth transistor have the same channel widths, the same channel lengths, and the same threshold voltages.

11. The optical transmission circuit according to claim 6, wherein
the fourth transistor and the fifth transistor configure a current mirror circuit, and drain current of the fifth transistor is larger than drain current of the fourth transistor.

12. An optical transmission/reception circuit module, comprising:
the optical transmission circuit according to claim 6;
an optical transmission medium through which an optical signal outputted from the light emitting element of the optical transmission circuit is transmitted;
a light receiving element that receives the optical signal transmitted through the optical transmission path and generates an electric signal; and
an amplifying circuit that amplifies and outputs the electric signal.

* * * * *